(12) United States Patent
Anderson

(10) Patent No.: US 6,952,701 B2
(45) Date of Patent: Oct. 4, 2005

(54) SIMULTANEOUS ARRAY CONFIGURATION AND STORE ASSIGNMENT FOR A DATA STORAGE SYSTEM

(75) Inventor: Eric Anderson, Berkeley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 563 days.

(21) Appl. No.: 09/924,735

(22) Filed: Aug. 7, 2001

(65) Prior Publication Data

US 2003/0033577 A1 Feb. 13, 2003

(51) Int. Cl.$^7$ ............................................... G06F 17/30
(52) U.S. Cl. .............................. 707/101; 707/2; 707/3; 707/8; 707/9; 707/10; 707/102; 707/104.1
(58) Field of Search ............................ 707/2, 3, 4, 8, 707/9, 10, 101, 102, 104.1, 202, 206, 1, 11, 100; 700/18; 703/1, 2, 7; 706/12, 15, 13, 14, 45; 709/104, 214; 705/7, 22, 28, 400, 1, 10; 716/3

(56) References Cited

U.S. PATENT DOCUMENTS 6,230,151 B1 * 5/2001 Agrawal et al. ............... 706/12
6,411,922 B1 * 6/2002 Clark et al. ..................... 703/2
6,473,884 B1 * 10/2002 Ganai et al. .................... 716/3

* cited by examiner

Primary Examiner—Shahid Alam
Assistant Examiner—Fred I. Ehichioya

(57) ABSTRACT

A technique for designing a data storage system in which a configuration for memory devices and assignments of data stores to the devices are developed. A data structure having a plurality of nodes is stored in computer-readable memory. At least some of the nodes correspond to a physical data storage device having respective attributes. A plurality of data stores each have data storage requirements, such as capacity and bandwidth requirements, that are provided as input. The data stores are assigned recursively into the hierarchy, checking at each node that none of the attributes are exceeded by the requirements of the store. While the stores are assigned, the hierarchy may be modified to better accommodate the stores. The possible assignments which to not violate ant any attributes are compared to each other according to the goals of the system.

43 Claims, 3 Drawing Sheets

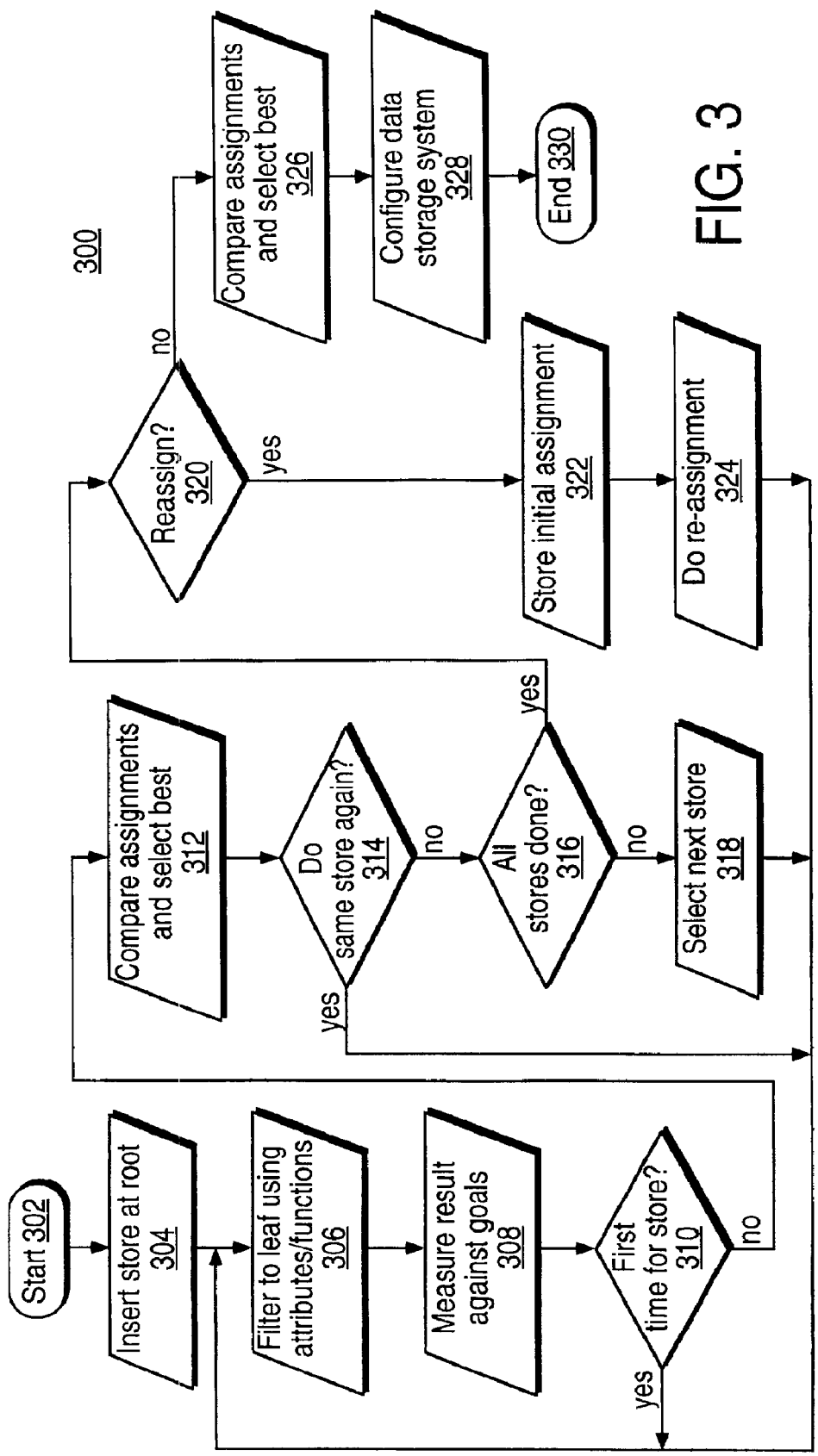

US 6,952,701 B2

SIMULTANEOUS ARRAY CONFIGURATION AND STORE ASSIGNMENT FOR A DATA STORAGE SYSTEM

FIELD OF THE INVENTION

The present invention relates to the field of data storage systems. More particularly, the present invention relates to the field of design and configuration of data storage systems.

BACKGROUND OF THE INVENTION

To minimize effort and expense, a data storage system may be designed for general-purpose use. That is, a single data storage system design may be used for many different applications. However, design trade-offs that are appropriate in one context may not be appropriate in another context. For example, in a storage system for serving Internet downloads, high bandwidth and fault tolerance may be priorities, whereas, in a storage system for archiving data records, low cost and low power consumption may be priorities. Accordingly, the specific goals and important features of a data storage system can be better achieved if the intended use of the storage system is taken into account during its design. Of course, a disadvantage of a specifically-designed storage system is in the costs associated with the design process.

The design of a storage system for a specific application generally requires that a skilled designer rely on experience while making design choices that are based on the requirements for the storage system and available information regarding possible memory devices to be incorporated into the storage system. Particularly, a variety of different memory devices form the building blocks of modern data storage systems. Specific devices can be based on, for example, optical, magnetic and/or electronic storage technologies and may include solid-state memory devices, magnetic tape drives and optical or magnetic disk drives and arrays. Memory devices can be further characterized, for example, by capacity, levels or types of redundancy provided (e.g., RAID-1 or RAID-5), bandwidth, cost, latency (e.g., read latency and/or write latency), and whether they are, for example, read and write capable, read-only capable, dynamic, static, volatile, or non-volatile.

Further, to make use of such devices, some infrastructure is generally required for the data storage system. For example, a data storage system may include data communication channels, such as communication buses, controllers (e.g., disk and bus controllers), power supplies and may be adapted to connect to host systems.

Additionally, various data elements, such as files or databases, may be placed in a storage system in a number of different ways. This task is difficult because the data elements will apply a load to the system. The placement will therefore impact the resulting performance of the storage system. Over-committing a particular component may be result in poor performance. Conversely, over-purchasing the resources results in a system that is not cost-effective. The administrator therefore wishes to find a solution which will not over-commit resources, but will also not waste resources. This task quickly becomes more complicated when one attempts to apply additional constraints. For example, certain types of the data may only be suitable for storage in certain types of the memory devices.

Because specialized skills are required to select appropriate storage devices for a specific data storage system, to configure the devices, to provide appropriate infrastructure, and to assign data elements to the devices, such specially-designed storage systems tend to be expensive. Further, due to lack of a systematic approach, the design process can be time consuming and may yield a poor result.

Accordingly, it would be desirable to provide a technique for the design of a data storage system that is more systematic, more likely to yield optimal results and that is less time-consuming than conventional design techniques.

SUMMARY OF THE INVENTION

The invention is a technique for the design of a data storage system in which a configuration for memory devices and assignments of data stores to the devices are developed. The invention is systematic and, thus, may be automated. As such, the invention is expected to reduce the need for specialized skills in the design of data storage systems and to produce better results than prior techniques.

In one aspect of the invention, a method of, and an apparatus for, designing a data storage system are provided. A data structure having a plurality of nodes is stored in computer-readable memory. At least some of the nodes correspond to a physical data storage device having respective attributes. Other nodes may be present for grouping related nodes. A plurality of data stores each have data storage requirements, such as capacity and bandwidth requirements, that are provided as input. The data stores are assigned recursively into the hierarchy, checking at each node that none of the attributes are exceeded by the requirements of the store. While the stores are assigned, the hierarchy may be modified to better accommodate the stores. The possible assignments which do not violate any attributes are compared to each other according to the goals of the system.

Once the plurality of data stores are assigned to the data structure, the data structure represents a first design for the data storage system. A metric representative of how well the first design meets the one or more goals for the data storage system may be determined. Some of the stores may be reassigned to the data structure thereby forming a second design for the data storage system. A metric representative of how well the second design meets the one or more goals for the data storage system may be determined. One of the first design and the second design may be selected based on the first and second metrics.

The re-assignment process may be repeated a plurality of times in order to further improve the design.

BRIEF DESCRIPTION OF THE DRAWINGS

FIG. 3 illustrates a flow diagram of a solver process for configuring the device tree of FIG. 1 in accordance with the present invention.

DETAILED DESCRIPTION OF A PREFERRED EMBODIMENT

An aspect of the design of data storage systems involves the assignment of data stores to appropriately configured data storage devices. A data "store," as used herein, may be data storage space, such as a logically contiguous block of storage, striped data storage or concatenated data storage, that is presented to an application (e.g., a software application). In practice, a store may be implemented as a logical volume into which data elements, such as files or a database, may be inserted, removed or manipulated. Each store may have a related stream or group of streams. A "stream," as used herein, may describe a sequence of reads and/or writes to the related store. For example, the stream may describe the rate and sequence of input/output operations performed to the store.

Each store and related stream(s) will generally have requirements, such as size or capacity, read/write bandwidth, read/write latency and availability. Because the stores are presented to applications, the requirements for the stores, such as capacity, number and other constraints, represent requirements of the storage system under design. These requirements can be derived from the intended use of the storage system, such as from the nature and requirements of the specific applications it is intended to serve.

Figure 1:
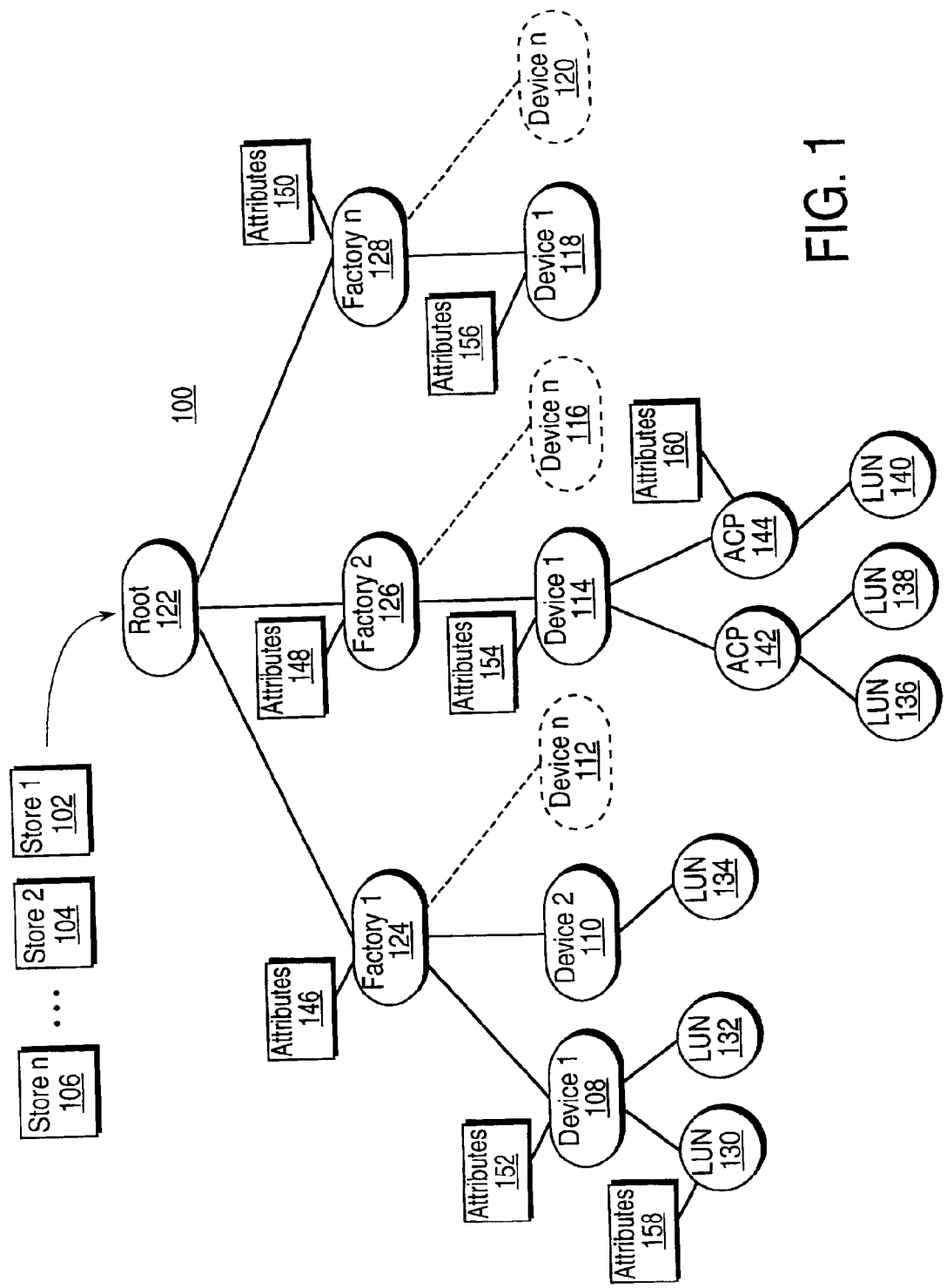
FIG. 1 illustrates diagrammatically a device tree data structure in accordance with the present invention in which stores are to be assigned to devices represented in the tree and the devices are to be configured.
Figure 2:
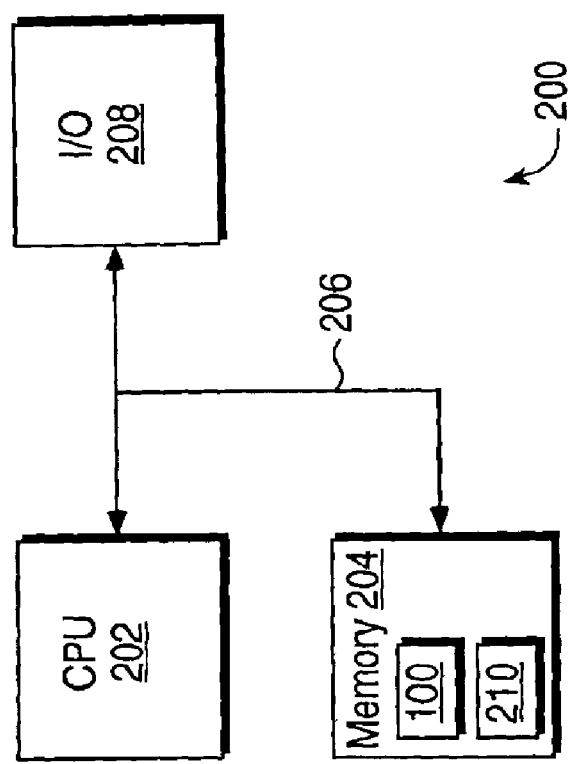
FIG. 2 illustrates a block schematic diagram of a general-purpose computer system in which the device tree data structure of FIG. 1 may be stored and manipulated in accordance with the present invention.

FIG. 1 illustrates diagrammatically a device tree data structure 100 in accordance with the present invention in which stores 102, 104, 106 are to be assigned to data storage devices 108–120 represented in the tree 100 and the devices 108–120 are to be configured. The devices 108–120 to be included in the storage system under design are represented by the device tree 100. The device tree 100 may itself be stored in computer memory as a data structure which is preferably hierarchical, though other data structures may be used, such as a list structure or "flattened" tree structure. For example, FIG. 2 illustrates a block schematic diagram of a general-purpose computer system 200 in which the device tree data structure 100 of FIG. 1 may be stored and manipulated in accordance with the present invention. The computer system 200 may include a general-purpose processor 202, a memory 204, such as persistent memory (e.g., a hard disk for program memory) and transitory memory (e.g., RAM for storing the device tree 100), a communication bus 206, and input/output devices 208, such as a keyboard, monitor and mouse. The computer system 200 is conventional. As such, it will be apparent that the system 200 may include more or fewer elements than shown in FIG. 2 and that other elements may be substituted for those illustrated in FIG. 2. A solver software program 210 may be stored in the memory 204 for manipulating the device tree 100 in accordance with the present invention.

Referring again to FIG. 1, the device tree 100 may include a representation of all of the devices and sub-devices currently existing in the design, as well as devices and sub-devices that may possibly be added to the design. For example, devices may be added by creating new nodes in the tree 100. As explained in more detail herein, other possible modifications to the tree 100 may include, for example, changing the type of disk drive of a particular device, increasing or decreasing the capacity of a device or disk, changing a RAID level or purchasing additional cabinets to allow for more disks. More generally, the types of changes that may be performed are determined by the possible configurations for the design of the storage system.

The device tree 100 has as its origin at a root node 122. Branches from the root 122 may extend to a next level down in the hierarchy. Relationships between adjacent levels in the hierarchy can be considered as parent-child relationships. Thus, the root 122 in FIG. 1 is the parent of nodes 124, 126 and 128 at the next level down, whereas, the nodes 124, 126 and 128 are the children of the root node 122. While three children nodes are illustrated, it will be apparent that more or fewer nodes may be provided.

The nodes 124, 126 and 128 may each represent a device producer. A device producer may also be referred to as a "factory," which is a node in the tree 100 that is capable of creating new nodes as its children. The children 108–120 of the nodes 124, 126, and 128 may represent data storage devices, such as disk arrays. Accordingly, the nodes 124, 126 and 128 may each produce new devices as its children, as needed, during the storage system design and configuration process. While producer nodes need not actually manufacture new devices, they may, for example, represent the act of adding devices to the design for the storage system or purchasing new devices for the design.

The device factory 124 may, for example, produce a particular model of disk array such as the model designation "FC30" disk array available from Hewlett-Packard Company. Accordingly, the children 108 and 110 of the factory 124 may represent actual FC30 devices. Another child node 112 of the factory 124 may represent a "virtual" FC30 device. By "virtual" this means that the child 112 represents a particular FC30 disk array device that could possibly be added to the design, should the need arise, but that has not yet been added to the design. The ability to add devices to the tree 100 may be represented by factory nodes or by virtual nodes or by both. Further, in certain circumstances, requirements for the data storage system under design may include restrictions on the ability to add devices to the design, in which case, factories and virtual nodes may not be present in some or all of the branches in the device tree 100.

Data storage devices may contain or make available data storage capability referred to herein as "logical units" (LUs). A logical unit may be, for example, a single disk, a portion of a disk, a disk array, a portion of a disk array, a redundant array of inexpensive disks (RAID) group, or a portion of a RAID group. A variety of different parameters, such as RAID level (e.g., levels 1 through 5), stripe size and number of disks used, may be associated with each LU. Further, the devices may have constraints and properties for associated LUs such as caching policies, pre-fetching policies, capacity, utilization parameters and limits on the number of disk drives that can be part of a device.

Accordingly, the storage devices 124–128 may have associated LUs 130–140. For example, LUs 130 and 132 may be associated with the device 108, while LU 134 may be associated with the device 110. Further, devices in the tree 100 may include sub-devices. For example, device 114 may be a disk array that includes multiple array controller processors (ACPs). For example, a pair of ACPs may be provided for fault tolerance or load balancing purposes. These may be represented in the device tree 100 of FIG. 1 by ACPs 142 and 144. Further, sub-devices in the tree 100 may have associated LUs. Thus, as shown in FIG. 1, the ACP 142 may be associated with LUs 136 and 138, while the ACP 144 may be associated with LU 140. Note that the use of LUs is not necessary as the assignment of stores may be made directly to the devices rather than to the LUs included in the devices. Assignment of the stores to the LUs, however, is useful to further specify in more detail the assignments of stores within the devices.

Associated with some or all of the nodes of the device tree 100 may be attributes 146–160. For example, factory 124 may have associated attributes 146 while the device 108 may have associated attributes 152. The attributes 146–160 may represent various properties of the elements of the device tree 100 such as the price of a particular device, the capacity of an associated LU or the utilization of SCSI buses attached to a device. The attributes for a factory may, for example, specify the type of device produced by the factory or a maximum number of devices the factory is capable of producing. Some attributes, such as those related to a communication bus, may be shared by multiple devices in the device tree 100, such as where the multiple devices share the communication bus. As another example, an attribute may be a constraint on the permissible configuration of the associated device. For example, a particular disk array may have a minimum and a maximum number of drives. It will be apparent that other attributes may be specified, depending on the circumstances.

The attributes 146–160 in the tree 100 provide an interface to the device tree 100 for the solver software program 210 (FIG. 2). The solver 210 uses the attributes of a node to determine whether the node may accommodate a particular data store. To accomplish this, the solver 210 may compare the attributes of the node to the requirements of the store. In addition, where indicated, the solver may apply various functions to the attributes of a node so as to transform the node in some manner. For example, a function may be applied to a node that represents a physical data storage device or a node that represents a LU in order to modify the node to better accommodate a particular data store.

Available functions may be grouped into a number of classes. For example, the classes may include expansion functions and refinement functions. An expansion function may be one that expands the data storage capacity of a node. An example of one expansion function may be to add platters to the drives in a disk array represented by a node (e.g., node 108) in the tree 100, which generally increases storage capacity without increasing performance. Another example may be adding trays to a device for accommodating additional disks. Refinement functions may make changes to the performance of a node that increase some attributes while decreasing others. An example of a refinement function may be to replace one or a few large, slow disk drives with several smaller and faster disk drives. Another example may be to change RAID level 5 to RAID level 1 for a device or associated LU. While such a change would be expected to decrease capacity, it also would also be expected to increase the ability to handle small, random writes. These expansion and refinement functions may affect a single device, node or LU. Alternately, a function may concurrently affect multiple devices, nodes or LUs.

Another task of the solver 210 is to assign stores (e.g., stores 102–106) to the devices (e.g., devices 108–120) and/or LUs (e.g., LUs 130–140) of the tree 100 based upon the requirements of the stores and upon the attributes of the devices and LUs in the tree 100. A possible assignment is one in which the requirements of the store are satisfied by the assigned device or LU and where the existence and configuration of the device or LU is consistent with stated goals (e.g., price and performance requirements) for the design of the data storage system.

Once an assignment or a transformation has been performed to a node, the solver then determines whether the new configuration of the node is improved in comparison to the configuration prior to the change or changes. If the new configuration is not improved, then the new configuration may be discarded. The solver 210 may then backtrack to the prior configuration and try additional changes. However, if the new configuration is improved, then the new configuration may be adopted as the current configuration. Additional functions may then be applied to the adopted configuration with those that result in further improvement being adopted and those that do not being discarded. A record may be maintained of the various different configurations that have been tried to avoid unnecessarily re-trying the same or similar configuration.

The measure of whether a change to the device tree 100 represents an improvement over the prior configuration of the device tree 100 may be with reference to the stated goals or specifications of the data storage system under design. For example, if a goal is low cost, a change that reduces cost may be considered an improvement. However, if a change results in a modest cost savings and also a significant degradation in capacity or some other stated goal, then the change may not be considered an improvement. Thus, several different goals of different levels of importance may be input to the invention for the purpose of making the determination of whether a change is, in fact, an improvement. For example, goals may be given weights that represent their relative importance. Further, some goals may be designated as rigid. For example, an absolute limit may be placed on the cost of the data storage system. Thus, other constraints may be overrun to ensure that a not-to-exceed cost constraint is maintained.

FIG. 3 illustrates a flow diagram 300 of a solver process for configuring the device tree 100 of FIG. 1. As mentioned, a software program 210 which implements the solver process of FIG. 3 may be stored in the memory 204 of the computer system 200 of FIG. 2 for causing the processor 202 to manipulate the device tree data structure 100. It is assumed that goals for the design, such those related to as price and performance have been determined. It is also assumed that the stores to be assigned to the storage system and their related requirements have also been determined. For example, representations of the goals and stores may be stored in the memory 204.

Referring to FIG. 3, program flow begins in a start state 302. From the state 302, program flow moves to a state 304. In the state 304, a first one of the stores (e.g., store 102) may be inserted into the device tree 100, such as at its root 122. The order in which the stores are inserted to the tree 100 may be pre-arranged into a specified order or may be in random order. For example, a pre-arranged order may be such that stores having larger storage capacity requirements may be inserted to the tree 100 before stores that have lower storage capacity requirements are inserted.

From the state 304, program flow moves to a state 306 in which the store 102 may be filtered down through the device tree 100 until it reaches a leaf (e.g., a device or LU node without children). This filtering may be accomplished by comparing the requirements of the store to the attributes encountered at each node along a branch within the tree 100. If the comparison indicates that the store is compatible, then the store may be passed along the branch until a compatible leaf is reached or it is determined that no compatible leaf exists on the branch. For example, the store 102 may be passed to the factory node 124 where attributes of the factory node 124 and/or its children 108 or 110 may be compared to the attributes of the store 102. If the comparison determines that one of the devices 108 or 110 is available and is compatible, then the store 102 may be passed to an appropriate one of the devices 108 or 110. Further comparisons of the requirements of the store 102 to attributes of the devices 108, 110 and/or LUs 130 and 132, respectively, may indicate that the store can be passed to one of the LUs 130 or 132.

Alternately, if no compatible node is found on the branch of the tree 100, then the search for an assignment for store 102 may backtrack up the tree 100 and one or more other branches tried in order to find a compatible node for the store. Further, an expansion or refinement function may be invoked at a node in order to modify the node into compatibility with the store. For example, if a capacity attribute of a node does not meet the capacity requirement of the store, an expansion function may be invoked at a device node to add capacity to the device as needed to accommodate the store 102. As another example, a factory node may add a device node to the design in order to accommodate the store. Thus, if a comparison at the factory 124 determines that neither device 108 or 110 is available for the store 102, but that a new device (e.g., a virtual device 112) can accommodate the store 102, then the device 112 may be added and the store 102 may be assigned to the device 112.

Once the store (e.g., the store 102) has been assigned to a compatible node or LU, program flow moves to a state 308. In the state 308, one or more metrics may be obtained that are representative of how well the placement of the store meets the design goals for the system. Preferably, one metric is obtained for each stated design goal. For example, where a goal is to minimize the overall cost of the storage system, the metric may indicate the cost associated with the assignment. As another example, where access speed is a goal, the metric may indicate access times expected for the store as a result of the assignment. These metrics may then be stored for later comparisons.

From the state 308, program flow moves to a state 310. In the state 310, a determination may be made as to whether the store (e.g., store 102) placed in the device tree 100 in the state 306 was assigned for the first time or whether the assignment was a second (or subsequent) assignment of the store. This is to ensure that the store is placed in at least two different locations in the tree 100, if possible, so that its assignment can be optimized by choosing an assignment that best achieves the design goals for the system from among multiple possible assignments. Accordingly, if the store has been placed only once, then the store may be removed from the device tree 100, and program flow may return to the state 306, where the store is re-inserted and filtered to a new location (state 306) and metrics obtained for the new location (state 308).

Rather than placing the store in two different locations for comparison, the store may be assigned to the same location, but under different configurations. For example, a first assignment of a store may be to a device or LU configured to store the data in accordance with RAID level 1. A second assignment of the store may be to the same device or LU, but configured in accordance with RAID level 5. The solver may then compare metrics obtained for these two configurations.

Then, once at least two possible assignments have been made for the store and metrics obtained for each assignment, program flow moves from the state 310 to a state 312. In the state 312, a comparison may be made between the metrics obtained for these two prior iterations to determine which best achieves the design goals for the system. Assignments which are not selected may be discarded.

From the state 312, program flow moves to a state 314 in which a determination may be made as to whether another iteration should be performed. For example, this may result in locating a still-better assignment for the store. Assuming that another iteration is to be performed, program flow may return to the state 306 where the process repeats with the assignment of the store selected in the state 312 serving as a baseline for comparison to a metrics obtained for a new assignment.

Once a store has been placed in the tree once, each additional assignment may be performed recursively in the manner described above. By starting the search for an appropriate location in the tree 100 for a next assignment at the same level of the tree as the previous assignment was found, a depth-first search or breadth search first may be performed. It will be apparent that other search techniques may be performed, such as simply re-inserting the store at the root 122 (FIG. 1) for each iteration. Further, any number of iterations may be performed. For example, a predetermined number (e.g., three or four) may be performed, or all possible assignments may be exhausted, before applying this process to a next store. Thus, assuming no additional iterations are to be performed for the store, then program flow moves from the state 314 to a state 316.

In the state 316, a determination may be made as to whether all the stores 102–106 (FIG. 1) have been inserted into the tree 100 and assigned to a suitable device or LU. Assuming not all of the stores have been assigned, program flow moves to a state 318 where a next store (e.g., the store 104 of FIG. 1) may be selected. For example, if the stores are to be inserted into the tree in a particular order (e.g., largest to smallest) then the next store in order may be selected in the state 318. From the state 318 program flow returns to the state 304 where the next store may be inserted into the tree (state 304) and the process of assigning the store to a position in the tree 100 may be performed.

Rather than assigning the stores to the tree 100, one-by-one, as described above, groups of stores or all of the stores may be inserted to the tree 100 together. At each node, comparisons may be made for each of the inserted stores to determine whether the store is compatible or whether the node should be modified. One or more of the stores may be assigned to the node. Then, a next node may be selected and requirements of the remaining, unassigned stores compared to that next node. This process may continue recursively until all of the stores are assigned to the tree 100.

Assuming that in the state 316, it is determined that all of the stores have been assigned to the device tree 100 (and that the elements of the tree 100 have been appropriately configured using expansion or refinement functions), then program flow moves from the state 318 to a state 320. Because all of the stores have been assigned to the device tree 100 and the device tree 100 configured to accommodate each store, the data storage system may then be configured according to the present state of the device tree 100. In which case, the design process may terminate.

However, it may be desirable to repeat at least some portions of the above-described assignment and configuration process in order to determine whether a better solution may be achieved. For example, the order in which the stores were inserted into the device tree 100 may affect the eventual assignments and configuration of the tree 100 and, thus, the resulting design of the storage system. Accordingly, assigning at least some of the stores in another order may affect the resulting design. Thus, in the state 320, a determination may be made as to whether a reassignment should be performed.

Assuming a reassignment is to be performed, program flow moves from the state 320 to a state 322. In the state 322, the present state of the device tree 100 may be stored. This may include, for example, storing indicia of all of the assignments of stores to the tree 100 and the corresponding metrics which indicate how well the assignments achieve the stated goals of the data storage system under design.

From the state 322, program flow moves to a state 324. In the state 324, one or more of the stores may be removed from the device tree 100 and re-inserted again at its root 122 (FIG. 1). For example, all of the stores assigned to a single storage device may be removed from the tree 100. While less than all of the stores for a single storage device may be removed, no storage device may be removed from the design unless it has no stores assigned to it. Accordingly, removing less than all of the stores for a device is not generally expected to result in a significant improvement to the design. However, doing so may improve the design with respect to other goals, such as load balancing. As another example, all of the stores assigned to multiple different storage devices may be removed from the tree 100. Further, if desired, all of the stores may be removed from the tree 100 in the state 324. A disadvantage of removing of all of the stores is that it would be expected to take longer to assign all of the stores and the result is not expected to be significantly different than the case where fewer than all of the stores are removed. This disadvantage may be overcome, however, in some cases where the ordering of the stores is changed prior to reinsertion.

Once previously assigned stores are removed from the device tree 100 in the state 324, program flow returns to the state 306 where the above-described process restarts for the removed stores. Thus, all of the stores removed from the tree 100 may be re-inserted. Similarly to the initial assignment, the stores being reassigned may be inserted into the device tree 100 in random order or in a predetermined order (e.g., largest to smallest). However, the order is preferably altered from that of the initial assignment. This reassignment process may be performed one time, multiple times or not at all.

When program flow returns to the state 320 and no additional reassignments are to be performed, program flow moves from the state 320 to a state 326. In the state 326, metrics for the initial assignment stored in the state 322 may be compared to metrics achieved after the reassignment (performed in the state 324). The design which best achieves the design goals for the system may be selected. The assignment which does not may be discarded.

From the state 326, program flow may move to a state 328 in which an actual data storage system may be constructed in accordance with the design selected in the state 326. From the state 328, program flow may terminate in a state 330.

Accordingly, two levels of assignment, measurement and comparison may be implemented to achieve an optimal design for the data storage system. A first level occurs when individual stores are assigned to the device tree 100 and the results for comparison are obtained with the same store in different assignments. This may occur, for example, in the loop that includes states 304, 306, 308, 310, 312 and 316. Since not all the stores have yet been assigned to the tree 100, the metrics compared in the state 312 may account only for the individual store undergoing placement in the tree 100. For example, assuming minimizing cost of the data storage system is a design goal, the comparison made in the state 312 may be of the cost of the specific devices needed to accommodate the store currently undergoing assignment to the device tree 100.

A second level of assignment, measurement and comparison occurs when all of the stores of the tree 100 have been assigned to the tree 100 and, then, certain stores are removed and reassigned. This may occur for example, in the loop that includes the states 322 and 324 (and the states 304–320). Because all of the stores have been assigned to tree 100, the comparison made in the state 326 is a "global" comparison in that it may account for all of the stores. For example, assuming that minimizing cost of the data storage system is a design goal, the comparison made in the state 326 may be of the total cost of two or more different versions of the entire data storage system under design.

It is expected that providing these two levels of measurement and comparison will result in storage system designs that are better optimized while minimizing computations required to achieve them. It will be apparent that other levels of measurement and comparison may be used that are intermediate to these two described levels. For example, two possible configurations for a portion of the tree 100, such as one or more branches, may be compared to each other.

While the foregoing has been with reference to particular embodiments of the invention, it will be appreciated by those skilled in the art that changes in these embodiments may be made without departing from the principles and spirit of the invention, the scope of which is defined by the following claims.

What is claimed is:

1. An apparatus for data store assignment for a data storage system design, comprising:
   a data structure stored in computer-readable memory, the data structure having a plurality of nodes, at least some of the nodes each representing a physical data storage device having respective attributes;
   representations of a plurality of data stores, each data store having respective requirements; and
   a solver process stored in computer-readable memory for assigning the representations of data stores to the data structure based on comparisons of the attributes of the nodes to the requirements of the data stores wherein the solver process makes a first assignment of a store and determines a first metric representative of how well the first assignment meets one or more goals for the data storage system and wherein the solver makes a second assignment of the store and determines a second metric representative of how well the second assignment meets the one or more goals and wherein the solver selects one of the first assignment and the second assignment based on the first and second metrics.

2. The apparatus according to claim 1, wherein the solver process compares the requirements of the store to the attributes of one or more of the data storage devices and when the comparison indicates compatibility, the solver process makes the first assignment of the store.

3. The apparatus according to claim 2, wherein the plurality of nodes are arranged in a hierarchy.

4. The apparatus according to claim 1, wherein the solver process makes at least one additional assignment of the data store.

5. The apparatus according to claim 4, wherein the solver process selects one of the first assignment, the second assignment and the at least one additional assignment based on how well goals for the data storage system are met.

6. The apparatus according to claim 1, wherein when the solver process assigns all of the stores to the data structure, the data structure represents a first design for the data storage system and wherein the solver determines a metric representative of how well the first design meets the one or more goals for the data storage system.

7. The apparatus according to claim 6, wherein the solver process reassigns at least one of the stores to the data structure thereby forming a second design for the data storage system and wherein the solver determines a metric representative of how well the second design meets the one or more goals for the data storage system.

8. The apparatus according to claim 7, wherein the solver process selects one of the first design and the second design based on the first and second metrics.

9. The apparatus according to claim 7, wherein the solver process reassigns a plurality of the stores to the data structure to form the second design.

10. The apparatus according to claim 7, wherein the solver process reassigns some of the stores to the data structure by removing all of the stores assigned to a particular one of the data storage devices.

11. The apparatus according to claim 10, wherein the solver process removes a storage device from the design when no stores are assigned to the storage device.

12. The apparatus according to claim 7, wherein the plurality of nodes are arranged in a hierarchy.

13. The apparatus according to claim 1, wherein one or more of said comparisons do not indicate compatibility, the solver process modifies one or more of the attributes of one or more of the data storage devices.

14. The apparatus according to claim 1, wherein one or more of said comparisons do not indicate compatibility, the solver process adds one or more additional nodes to the data structure.

15. The apparatus according to claim 1, wherein the solver process assigns at least some of the stores to the data structure and then removes at least one of the stores from the data structure.

16. The apparatus according to claim 15, wherein the solver process removes a storage device from the design when no stores are assigned to the storage device.

17. An apparatus for data store assignment for a data storage system design, comprising:
a data structure stored in computer-readable memory, the data structure having a plurality of nodes, at least some of the nodes each representing a physical data storage device and having respective attributes;
representations of a plurality of data stores, each data store having respective requirements; and
a solver process stored in computer-readable memory for assigning the representations of data stores to the nodes wherein the solver process compares the requirements of a store to the attributes of one or more of the data storage devices and when the comparison indicates compatibility, the solver process makes a first assignment of the store and when the comparison does not indicate compatibility, the solver process modifies one or more of the attributes of one or more of the data storage devices.

18. The apparatus according to claim 17, wherein the solver process makes at least one additional assignment of the data store.

19. The apparatus according to claim 18, wherein the solver process selects one of the first assignment and the at least one additional assignment based on how well one or more goals for the data storage system are met.

20. The apparatus according to claim 19, wherein when the solver process assigns all of the stores to the data structure, the data structure represents a first design for the data storage system and wherein the solver determines a metric representative of how well the first design meets the one or more goals for the data storage system.

21. The apparatus according to claim 20, wherein the solver process reassigns some of the stores to the data structure thereby forming a second design for the data storage system and wherein the solver determines a metric representative of how well the second design meets the one or more goals for the data storage system.

22. The apparatus according to claim 21, wherein the solver process selects one of the first design and the second design based on the first and second metrics.

23. The apparatus according to claim 21, wherein the solver process reassigns some of the stores to the data structure by removing all of the stores assigned to a particular one of the data storage devices.

24. The apparatus according to claim 23, wherein the solver process removes a storage device from the design when no stores are assigned to the storage device.

25. The apparatus according to claim 19, wherein the plurality of nodes are arranged in a hierarchy.

26. The apparatus according to claim 17, wherein the solver process assigns at least some of the stores to the data structure and then removes at least one of the stores from the data structure.

27. The apparatus according to claim 26, wherein the solver process removes a storage device from the design when no stores are assigned to the storage device.

28. A method of data store assignment for a data storage system design, comprising:
providing a data structure stored in computer-readable memory, the data structure having a plurality of nodes, at least some of the nodes each representing a physical data storage device having respective attributes;
providing a representation of a data store having requirements;
comparing the requirements for the data store to attributes of devices in the data structure;
making a first assignment of the representation of the data store to the data structure based on results of said comparing;
determining a first metric for the first assignment according to how well the first assignment meets one or more goals for the data storage system;
making a second assignment of the representation of the data store based on said results of said comparing;
determining a second metric for the second assignment according to how well the second assignment meets the one or more goals for the data storage system; and
selecting the first assignment or the second assignment based on the first and second metrics.

29. The method according to claim 28, wherein the plurality of nodes are arranged in a hierarchy.

30. The method according to claim 28, further comprising modifying the attributes of one or more of the nodes into compatibility with the requirements of the data store.

31. The method according to claim 28, further comprising making at least one additional assignment of the data store.

32. The method according to claim 31, wherein the solver process selects one of the first assignment, the second assignment and the at least one additional assignment based on how well goals for the data storage system are met.

33. The method according to claim 28, further comprising:
assigning all of a plurality of additional data stores to the data structure and when said assigning all of the additional data stores is completed, the data structure represents a first design for the data storage system; and
determining a metric representative of how well the first design meets the one or more goals for the data storage system.

34. The method according to claim 33, further comprising:
reassigning some of the stores to the data structure thereby forming a second design for the data storage system; and
determining a metric representative of how well the second design meets the one or more goals for the data storage system.

35. The method according to claim 34, further comprising selecting one of the first design and the second design based on the first and second metrics.

36. The method according to claim 34, said reassigning comprising removing all of the stores assigned to a particular one of the data storage devices.

37. A method of data store assignment for a data storage system design, comprising:
- providing a data structure stored in computer-readable memory, the data structure having a plurality of nodes, at least some of the nodes each representing a physical data storage device having respective attributes;
- providing representations of a plurality of data stores, each having requirements;
- comparing the requirements for each data store to attributes of devices in the data structure;
- making a first assignment of the representations of each of the plurality of stores to the data structure based on results of said comparing;
- determining a first metric for the first assignment according to how well the first assignment meets one or more goals for the data storage system;
- making a second assignment of the representations of each of the plurality of data stores based on said results of the said comparing;
- determining a second metric for the second assignment according to how well the second assignment meets the one or more goals for the data storage system; and
- selecting the first assignment or the second assignment based on the first and second metrics.

38. The method according to claim 37, wherein the plurality of nodes are arranged in a hierarchy.

39. The method according to claim 37, wherein when said comparing does not indicate compatibility, modifying one or more of the nodes.

40. The method according to claim 39, said modifying comprising expanding data storage capacity of the one or more nodes.

41. The method according to claim 37, said data structure further comprising representations of data storage devices that can be added to a design for the data storage system, but have not been added to the design.

42. An apparatus for data store assignment for a data storage system design, comprising:
- a data structure stored in computer-readable memory, the data structure having a plurality of nodes, at least some of the nodes each representing a physical data storage device and having respective attributes;
- representations of a plurality of data stores, each data store having respective requirements; and
- a solver process stored in computer-readable memory for assigning the representations of data stores to the nodes wherein the solver process compares the requirements of a store to the attributes of one or more of the data storage devices and when the comparison indicates compatibility, the solver process makes a first assignment of the store and when the comparison does not indicate compatibility, the solver process adds one or more additional nodes to the data structure.

43. The apparatus according to claim 42, wherein the solver process makes a first assignment of the store to the one or more additional nodes.

* * * * *